United States Patent [19]

Meyer

[11] Patent Number: 5,206,211
[45] Date of Patent: Apr. 27, 1993

[54] PROCESS FOR THE PRODUCTION OF AN ELONGATE BODY CONSISTING OF LONGITUDINALLY ALIGNED ACICULAR CRYSTALS OF A SUPERCONDUCTING MATERIAL

[75] Inventor: Gundolf Meyer, Birmenstorf, Switzerland

[73] Assignee: Asea Brown Boveri Ltd., Baden, Switzerland

[21] Appl. No.: 751,568

[22] Filed: Aug. 22, 1991

Related U.S. Application Data

[63] Continuation of Ser. No. 494,394, Apr. 16, 1990, abandoned.

[30] Foreign Application Priority Data

Mar. 31, 1989 [CH] Switzerland ............ 1184/89

[51] Int. Cl.$^5$ .............. C04B 35/00; C04B 35/64; H01L 39/24
[52] U.S. Cl. ............................... 505/1; 505/704; 505/740; 264/65; 264/DIG. 26; 501/152; 501/126
[58] Field of Search .......... 505/704, 740; 264/65, 264/DIG. 26; 501/126, 152

[56] References Cited

U.S. PATENT DOCUMENTS

| | | | |
|---|---|---|---|
| 4,839,339 | 7/1989 | Bunker et al. | 505/1 |
| 4,923,849 | 5/1990 | Sherif | 505/1 |
| 5,021,395 | 6/1991 | Druliner et al. | 505/1 |

FOREIGN PATENT DOCUMENTS

| | | |
|---|---|---|
| 0282286 | 9/1988 | European Pat. Off. |
| 0298647 | 1/1989 | European Pat. Off. |
| 1-30114 | 2/1989 | Japan |
| 0030114 | 2/1989 | Japan ........................ 505/740 |

OTHER PUBLICATIONS

Holland et al., "Physical Properties of the Quaternary Oxide Superconductor YBa2Cu3O7", Accounts of Chem. Research, vol. 21, Jan. 1988 p. 8.
Chen et al., "Texture Development in YBa2Cu3Ox by Hot Extrusion and Hot-pressing", Jan. AGS, vol. 70 #12 Dec. 1987 p. C-388-90.
Applied Physics Letters, vol. 52, No. 21, May 23, 1988, Amer. Inst. of Physics, Grader et al.: "Improved press forging of Ba2YCu3Ox superconductor".
Japanese Journal of Applied Physics, vol. 27, No. 7, Jul. 1988, Takenaka et al.: "Superconducting properties of grain-oriented YBa2Cu3O7−x Ceramics".
Advanced Ceramic Materials, vol. 2, No. 3B, Special Issue, Jun. 1987.
Robinson et al.: "Sinter-forged YBa2Cu3O7−".
McCallum et al.: "Problems in the production of YBa2Cu3Ox superconducting wire".

*Primary Examiner*—Mark L. Bell
*Assistant Examiner*—C. M. Bonner
*Attorney, Agent, or Firm*—Oblon, Spivak, McClelland, Maier & Neustadt

[57] ABSTRACT

Process for the production of an elongate body of longitudinally aligned acicular crystals (3) of the superconducting substance $REBa_2Cu_3O_{6.5+y}$, with RE=rare earth metal, $0<y<1$, in which fine-grained powder (1) with a particle diameter of 0.1−5 μm is sintered for 1−100 h at a temperature of 600°−850° C. with application of a pressure of 100−5,000 bar. For the production of a filament conductor, the powder is filled into a small Ag tube (4), drawn, and pressure sintered at 800° C./10 h under 2,000 bar.

11 Claims, 3 Drawing Sheets

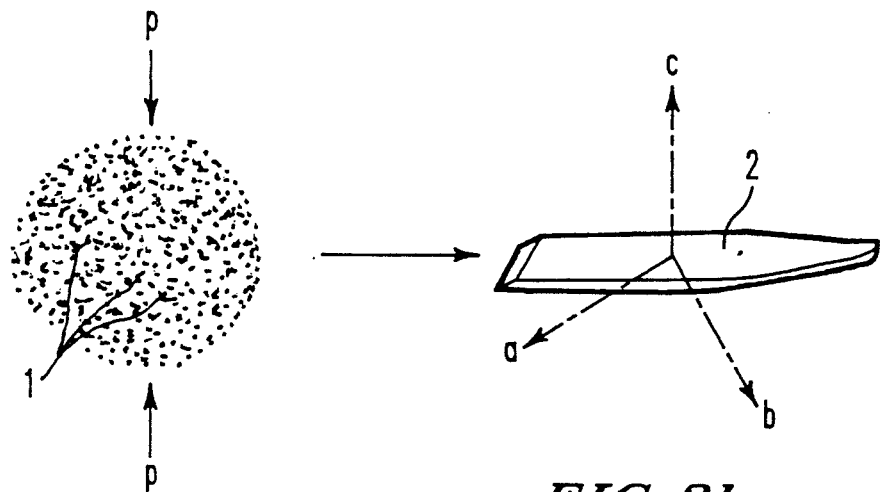
FIG. 3a
FIG. 3b
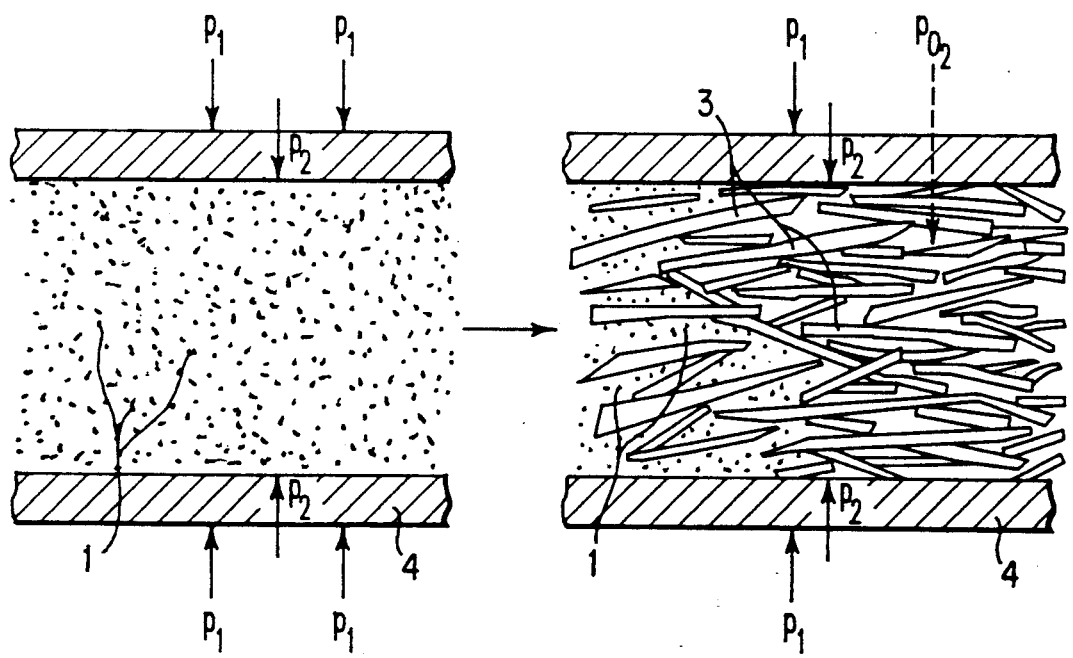
FIG. 4a
FIG. 4b

PROCESS FOR THE PRODUCTION OF AN ELONGATE BODY CONSISTING OF LONGITUDINALLY ALIGNED ACICULAR CRYSTALS OF A SUPERCONDUCTING MATERIAL

This application is a continuation of application Ser. No. 07/494,394, filed on Mar. 16, 1990, now abandoned.

BACKGROUND OF THE INVENTION

1. Field of the Invention

The present invention relates to technology of electrical superconductors. The importance of materials which have superconducting properties has greatly increased very recently. The discovery of new superconducting materials, in particular of the rare-earth-/Ba/Cu/O type, led to a considerable expansion of the possible applications of superconductors, since these materials already become superconducting at temperatures above 50 K.

The invention relates to the provision of suitable starting materials for the further development and improvement of components made of a ceramic high temperature superconductor in wire form, wherein the requirements of industrial large-scale production are to be taken into account.

It relates in particular to a process for the production of an elongate body consisting of longitudinally aligned acicular crystals of a superconducting ceramic material based on $REBa_2Cu_3O_{6.5+y}$, where RE means a rare earth metal and $0<y<1$, and the superconducting single crystals are produced by sintering.

2. Discussion of Background

It has been shown that ceramic high temperature superconductors of the class $REBa_2Cu_3O_{6.5+y}$ (RE= rare earth metal, $0<y<1$) have strongly anisotropic properties in every respect. This depends on the crystal structure (perovskite lattice) and is particularly the case for the critical current density $j_c$ (current carrying capacity). The grain boundaries in polycrystalline ceramics limit the critical current densities to small values, so that these materials are not suitable for most technical applications at the boiling temperature of liquid nitrogen (T=77 K.). For sintered samples of polycrystalline $YBa_2cu_3O_{-7}$, critical current densities $j_c$ up to a maximum of 100 $A/cm^2$ were measured up to now in magnetic fields $>1$ T. However, applications in, e.g., magnet coils require current densities which are greater by a factor of about 1,000.

It is apparent from the above that an oriented crystal structure can be expected to provide substantially higher critical current densities than crystallites arranged in a chaotic and statistically arbitrary manner. The highest current densities $j_c$, of more than $10^5$ $A/cm^2$, were observed in thin superconducting layers grown epitaxially on $SrTiO_3$ single crystals. However, this process necessitates expensive single crystals as substrates and cannot be applied to the production of very long wires (multiple filaments) and strips.

It is known that particles of the compound $YBa_2Cu_3O_{-7}$ can have an acicular or lamellar particle morphology arising from growth anisotropies. The short axis of these particles then corresponds crystallographically to the c-axis of the lattice. The long axes of the particles reproduce the a- or b-axes of the lattice, wherein these directions can accept markedly higher critical currents than the c-axis.

An effect known as secondary recrystallization is known in the literature. In secondary recrystallization, grain growth in a structure occurs in only a very small number of grains, which act as nuclei. The remaining grains in the structure hardly change, until they are completely used up by the growth of the nuclei. The nuclei can grow to grains of up to 1 mm. If the nuclei have a preferred orientation before the beginning of grain growth, a structure with a corresponding texture results from secondary recrystallization.

The following literature is cited in relation to the state of the art:

Quentin Robinson, P. Georgopoulos, D. Lynn Johnson, Henry O. Marcy, Carl R. Kannewurf, S.-J. Hwu, Tobin J. Marks, K. R. Poeppelmeier, S. N. Song, J. B. Ketterson, "Sinter-Forged $YBa_2Cu_3O_{7-\delta}$", Materials Research Center, Northwestern University, Evanston, Ill. 60201, Advanced Ceramic Materials, Vol. 2, No. 3B, Special Issue, June 1987

R. W. McCallum, J. D. Verhoeven, M. A. Noack, E. D. Gibson, F. C. Laabs and D. K. Finnemore, "Problems in the Production of $YBa_2Cu_3O_x$ Superconducting Wire", Ames Laboratory, USDOE, Iowa State University, Ames, Iowa 50011, Advanced Ceramic Materials, Vol. 2, No. 3B, Special Issue, June 1987

G. S. Grader, H. M. O'Bryan and W. W. Rhodes, "Improved Press Forging of $Ba_2YCu_3O_x$ Superconductor", 1988, American Institute of Physics, Appl. Phys. Lett. 52(21), May 23, 1988, pp. 1,831–1,833.

SUMMARY OF THE INVENTION

Accordingly, one object of this invention is to provide a process for the production of an elongate body consisting of longitudinally aligned acicular crystals of a superconducting ceramic material based on $REBa_2Cu_3O_{6.5+y}$, where RE means a rare earth metal and $0<y<1$, in which, proceeding from suitable starting materials, a sintering process is made use of. The crystals are to be oriented such that their c-axes are perpendicular to the long axis of the acicular particles and that the whole crystal composite is aligned with the long axes as much as possible in the long axis of the workpiece. The process is to be suitable for a superconducting composite surrounded by a stabilizing material (Ag) as a carrier and emergency current conductor.

This object is achieved in that, in the process mentioned at the beginning, superconducting powder with an average particle diameter of 0.1–5 μm is sintered for 1–100 h at a temperature in the region of 600°–850° C. with the application of a pressure of 100–5,000 bar.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 shows a schematic representation of the conversion of a loose powder of superconducting material into a single crystal by means of pressure sintering, FIG. 4 shows a schematic section (simplified metallographic representation) through an elongate body of acicular oriented crystals.

DESCRIPTION OF THE PREFERRED EMBODIMENTS

Figure 1:
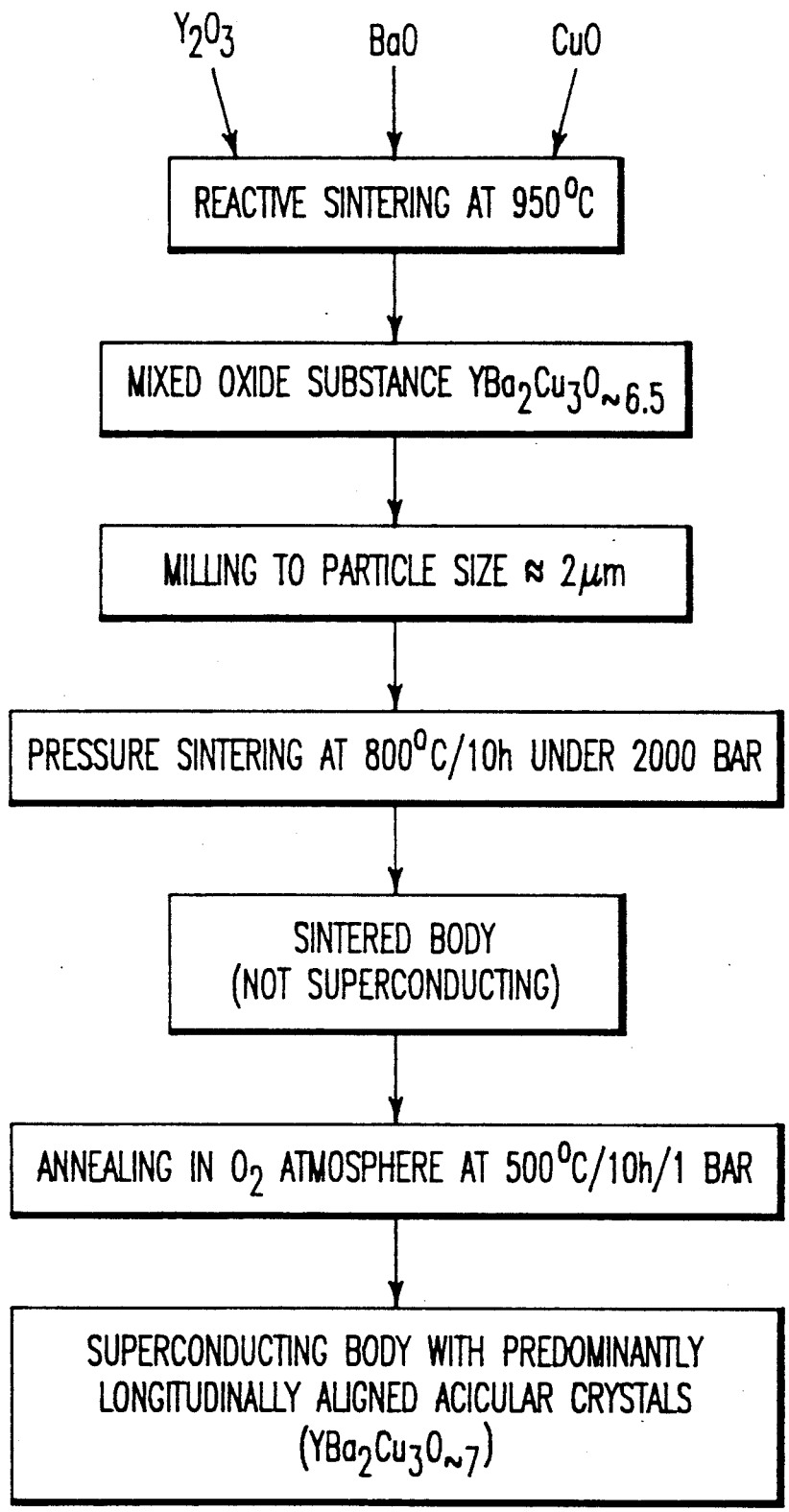
FIG. 1 shows a flow chart (block diagram) of a first variant of the process for the production of a body of acicular crystals of a superconducting ceramic material.

Referring now to the drawings, wherein like reference numerals designate identical or corresponding parts throughout the several views, there is represented in FIG. 1 a flow chart (block diagram) of a first variant of the process for the production of a body of acicular crystals of a superconducting ceramic material. In the present case the starting materials are fine-grained powders of the oxides $Y_2O_3$, BaO and CuO, which are converted into an agglomerate of the mixed oxide substance $YBa_2Cu_3O_{\sim 6.5}$ by reactive sintering at 950° C. and subsequent slow cooling. The sintered body produced by pressure sintering indeed has the correct $Y:Ba_2:Cu_3$ ratio, but for the time being is not yet superconducting. Superconductivity is produced by heat treating again in an $O_2$ atmosphere. The diagram needs no further explanation.

Figure 2:
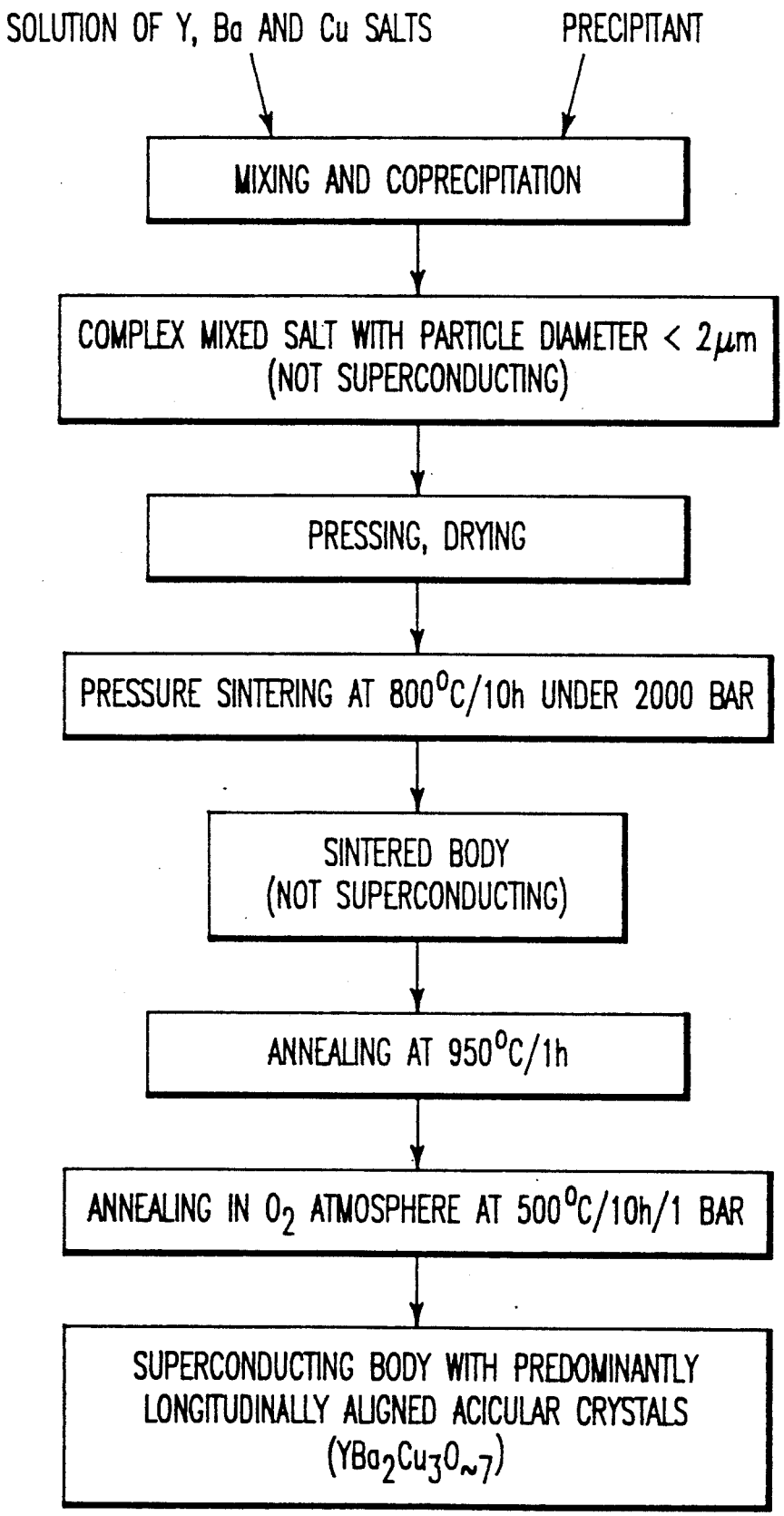
FIG. 2 shows a flow chart (block diagram) of a second variant of the process for the production of a body of acicular crystals of a superconducting ceramic material.

FIG. 2 relates to a flow chart (block diagram) of a second variant of the process for the production of a body of acicular crystals of a superconducting ceramic material. In this case, solutions of the Y, Ba and Cu salts are the starting materials, and are converted by a precipitating agent according to the coprecipitation process into a complex mixed salt (mostly carbonatehydrate or oxalate) with the correct $Y:Ba_2:Cu_3$ ratio. After pressing and drying, the process is exactly as in the first variant, wherein a sintered body is first produced which does not show superconducting properties. The diagram needs no further explanation.

FIG. 3 shows a schematic representation of the conversion of a loose powder of a superconducting material into a single crystal by pressure sintering. 1 is the fine-grained powder of superconducting material, $YBa_2Cu_3O_{\sim 7}$ in the present case, with a particle size of about 2 μm. p represents the pressure to be used externally in the pressure sintering process. Basically an acicular individual crystal (single crystal) 2 of superconducting material is produced in this process, with its crystallographic a/b plane lying in the preferred longitudinal direction, while the c-axis is perpendicular to the longitudinal direction. The best superconducting properties of the material are measured in the a/b plane, and thus coincide with the long axis of the single crystal 2.

There is represented in FIG. 4 a schematic section (simplified metallographic representation) through an elongate body of acicular oriented crystals. 1 is the fine-grained powder (particle size about 2 μm) of superconducting substance, which can also, however, be substituted by a complex mixed salt, not yet fully reacted (intermediate product from coprecipitation). 3 is the composite of elongate acicular single crystals of the superconducting substance (e.g., $YBa_2Cu_3O_{\sim 7}$). 4 is a small silver tube acting as a support and sheath, which at the same time takes on the function of emergency current conductor. p is the external pressure used during pressure sintering, and $p_2$ the corresponding internal pressure, still exerted on the fine-grained powder 1. $pO_2$ represents the $O_2$ partial pressure to be used in the sintering process or in the subsequent heat treatment, and which is to be used for the conversion of the material into the orthorhombic phase with the optimum superconducting properties.

EMBODIMENT EXAMPLE 1

See FIG. 1 and FIG. 3

A powder 1 for the superconducting substance $YBa_2Cu_3O_{6.5+y}$ with $y \approx 0.45$ was first prepared. The oxides $Y_2O_3$, BaO and CuO were used as starting materials for this purpose. Stoichiometric amounts of oxide powders with the atomic ratio Y:Ba:Cu=1:2:3 were mixed, milled, and pressed, and the pressing was reactively sintered at a temperature of 950° C. The sintered body was then milled, once more pressed, and again sintered, in order to produce a single, homogeneous phase. If necessary this process (sintering in the region of 930°-1,000° C.) was repeated several times, in order to eliminate any presence of a foreign phase not corresponding to the above stoichiometry. The finished, reacted sintered body was finally milled to a fine-grained powder 1 with an average grain size of 2 μm. A body 10 mm in diameter and 3 mm high was prepressed from this powder 1. The pressing was subjected to an axial ram pressure of 2,000 bar in a heated press for 10 hours at a temperature of 800° C. This pressure sintering process was carried out once under vacuum, and a further time in argon as a protective gas. As a variant, apart from this, a corresponding trial was carried out in an $O_2$ atmosphere of 1 bar pressure. In each case, the result was a body with comparatively coarse elongate acicular single crystals 2 (see FIG. 3) with their long axes oriented transversely to the direction of the externally applied pressure p. After the pressure sintering process, the body was annealed for 5 hours in the temperature region of 400°-500° C. in an $O_2$ atmosphere, in order to produce the superconducting substance with the optimum orthorhombic crystal structure corresponding to the formula $YBa_2Cu_3O_{\sim 7}$.

After cooling to 77 K., the critical current density $j_c$ was determined to be 1,200 A/cm².

EMBODIMENT EXAMPLE 2

See FIGS. 2 and 4

A body of the superconducting substance $YBa_2Cu_3O_{\sim 7}$ was produced. The powder was produced by the coprecipitation method. Stoichiometric amounts of Y, Ba and Cu salts were brought into solution and converted with a precipitant into an insoluble gel, which was converted into a powder by drying and subsequent heat treatment, and then into a sintered body. In the present case, the nitrates of Y, Ba and Cu were dissolved in $H_2O$ and precipitated out in the form of a complex mixed carbonatehydroxide, using Na carbonate. After multiple washings, dispersion using ultrasonics, drying, and expulsion of the $H_2O$ and a part of the $CO_2$, the powder of the nonsuperconducting intermediate product obtained in this manner was milled to a grain size of average 2 μm and filled into a small Ag tube 4 of 6 mm external diameter and 0.6 mm wall thickness. The filled Ag tube 4 was then drawn down to a wire of 0.5 mm external diameter and the whole was heat treated in similar manner to Example 1. The ends of the Ag tube 4 which had been drawn down into a thin wire were closed, the whole was placed under a hydrostatic pressure of 1,000 bar and was annealed at a temperature of 800° C. for 5 h. Annealing in an $O_2$ atmosphere was then carried out according to Example 1 at a temperature of 500° C. for 5 h. The composite thus formed consisted of a superconducting core of a composite 3 of acicular, aligned crystals of the substance $YBa_2Cu_3O_{\sim 7}$ and a sheath 4 of Ag which acted as a support and emergency current conductor.

The critical current density was 1,100 $A/cm^2$.

EMBODIMENT EXAMPLE 3

A powder of a complex mixed oxide with an average particle diameter of about 2 μm was produced according to Example 2. This powder was filled into a small Ag tube 4 of 8 mm external diameter and 0.8 mm wall thickness, and the whole was drawn down to a diameter of 0.6 mm. 7 such conductors were introduced into a small Ag tube of about 1.8 mm internal diameter and 0.4 mm wall thickness, and the bundle was drawn down to an external diameter of 0.6 mm. 7 such bundles were again introduced into a corresponding small Ag tube, and the whole was drawn down to a multifilament conductor of about 0.8 mm external diameter. A pressure sintering process according to Example 2 was now carried out at 920° C. for 5 h, and the whole was then annealed in an $O_2$ atmosphere at 500° C. for 5 h. The critical current density $j_c$ was determined to be 1,300 $A/cm^2$.

The invention is not limited to the embodiment examples.

The process for the production of an elongate body consisting of longitudinally aligned acicular crystals (3) of a superconducting ceramic material based on $REBa_2Cu_3O_{6.5+y}$, where RE means a rare earth metal and $0<y<1$, and the superconducting single crystals (2; 3) are produced by sintering is carried out in that superconducting powder (1) with a particle diameter of 0.1–0.5 μm is sintered for 1–100 h at a temperature in the region of 600°–920° C. with application of a pressure of 100–5,000 bar. Preferably the superconducting powder (1) has a particle diameter of 0.15–5 μm and the pressure is 500–2,000 bar, the sintering being carried out for 5–20 h at a temperature of at most 920° C.

According to a variant, the process is carried out in that, during sintering, a pressure of 2,000 bar and a temperature of 800° C. are applied for 10 h.

In many practical cases the superconducting powder (1) with an average particle size of 2 μm is filled into a small silver tube (4) and the whole is drawn down to a filament conductor and is sintered for 10 h at a temperature of 800° C. and at an external pressure of 2,000 bar to a superconductor wire made up of single longitudinally aligned acicular crystals (23).

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A process for the production of an elongate body of a high temperature superconductor consisting of longitudinally aligned acicular crystals of a superconducting ceramic material based on $REBa_2Cu_3O_{6.5+y}$, with RE=a rare earth metal and $0<y<1$, comprising the steps of
   preparing a homogeneous, non-superconducting precursor in powder form with an average particle diameter of 0.5–5 μm; said precursor containing the elements RE, Ba and Cu in a stoichiometric ratio of RE:Ba:Cu=1:2:3;
   forming from said precursor powder said elongate body;
   applying to said formed elongate body a pressure of 500–2,000 bar; and
   sintering said formed elongate body under said applied pressure for 5–20 h at a temperature of 600°–850° C.

2. The process as claimed in claim 1, wherein Y is chosen as said rare earth element RE.

3. The process as claimed in claim 2, wherein said non-superconducting precursor is prepared by mixing powders of $Y_2O_3$, BaO and CuO in said stoichiometric ratio and repeatedly sintering and milling said mixture.

4. The process as claimed in claim 2, wherein said non-superconducting precursor is prepared by coprecipitation.

5. The process as claimed in claim 1, wherein during said sintering, a pressure of 2,000 bar and a temperature of 800° C. are applied for 10 h.

6. The method of claim 11, wherein said superconductor wire has a critical current density of at least 1,100 $A/cm^2$.

7. A process for the production of a superconductor wire of a high temperature superconductor consisting of longitudinally aligned acicular crystals of a superconducting ceramic material based on $REBa_2Cu_3O_{6.5+y}$, with RE=a rare earth metal and $0<y<1$, comprising the steps of
   preparing a homogeneous, non-superconducting precursor powder of $REBa_2Cu_3O_{6.5+y}$ with an average particle diameter of 2 μm by mixing powders of an oxide of RE, BaO and CuO in a stoichiometric ratio of RE:Ba:Cu=1:2:3, and repeatedly sintering and milling said mixture;
   filling said non-superconducting precursor powder into a small silver tube, to form a filled silver tube;
   drawing said filled silver tube down to a filament conductor; and
   sintering said filled silver tube for 10 h at a temperature of 800° C. and at an external pressure of 2,000 bar to form said superconductor wire.

8. The method of claim 7, wherein said superconductor wire has a critical current density of at least 1,100 $A/cm^2$.

9. The process as claimed in claim 8, wherein Y is chosen as said rare earth element RE.

10. The process as claimed in claim 9, wherein said non-superconducting precursor is prepared by mixing powders of $Y_2O_3$, BaO and CuO in said stoichiometric ratio and repeatedly sintering and milling said mixture.

11. The process as claimed in claim 9, wherein said non-superconducting precursor is prepared by coprecipitation.

* * * * *